United States Patent
Koebrugge et al.

(10) Patent No.: US 7,541,306 B2
(45) Date of Patent: Jun. 2, 2009

(54) X8R DIELECTRIC COMPOSITION FOR USE WITH NICKEL ELECTRODES

(75) Inventors: Gerhardus W. Koebrugge, Nuenen (NL); Knuth Albertsen, Goch (DE); Willibrordus J. L. M. J. Coppens, Uden (NL)

(73) Assignee: Ferro Corporation, Cleveland, OH (US)

( * ) Notice: Subject to any disclaimer, the term of this patent is extended or adjusted under 35 U.S.C. 154(b) by 44 days.

(21) Appl. No.: 11/623,905

(22) Filed: Jan. 17, 2007

(65) Prior Publication Data

US 2008/0169530 A1 Jul. 17, 2008

(51) Int. Cl.
*C04B 35/468* (2006.01)

(52) U.S. Cl. ...................... 501/138; 501/139
(58) Field of Classification Search .................. 501/138, 501/139
See application file for complete search history.

(56) References Cited

U.S. PATENT DOCUMENTS

| | | | |
|---|---|---|---|
| 5,128,289 A | 7/1992 | Wilson | |
| 5,137,776 A | 8/1992 | Kahn | |
| 5,187,638 A | 2/1993 | Sandhu et al. | |
| 5,361,187 A | 11/1994 | Srinivasan | |
| 5,422,190 A | 6/1995 | Alexander | |
| 5,550,092 A | 8/1996 | Chu et al. | |
| 5,571,767 A | 11/1996 | Wilson et al. | |
| 5,635,435 A | 6/1997 | Shibata | |
| 5,646,080 A | 7/1997 | Chu et al. | |
| 5,858,901 A | 1/1999 | Chu et al. | |
| 5,862,034 A * | 1/1999 | Sato et al. ................. | 361/321.5 |
| 5,990,029 A | 11/1999 | Satoh et al. | |
| 6,185,087 B1 | 2/2001 | Park et al. | |
| 6,225,250 B1 | 5/2001 | Wada et al. | |
| 6,226,172 B1 | 5/2001 | Sato et al. | |
| 6,301,092 B1 * | 10/2001 | Hata et al. ................ | 361/321.2 |
| 6,403,513 B1 | 6/2002 | Sato et al. | |
| 6,411,195 B1 | 6/2002 | Goldman | |
| 6,544,916 B1 | 4/2003 | Sato et al. | |
| 6,548,437 B2 | 4/2003 | Sato et al. | |
| 6,556,422 B2 * | 4/2003 | Kim et al. ................. | 361/321.2 |
| 6,559,084 B1 | 5/2003 | Fujikawa et al. | |
| 6,699,809 B2 | 3/2004 | Fujikawa et al. | |
| 6,764,976 B2 | 7/2004 | Kobayashi et al. | |
| 6,809,052 B2 | 10/2004 | Horie et al. | |
| 6,828,266 B1 | 12/2004 | Park et al. | |
| 6,829,137 B2 | 12/2004 | Konaka et al. | |
| 7,061,748 B2 | 6/2006 | Ito et al. | |
| 7,161,795 B1 | 1/2007 | Megherhi et al. | |
| 7,381,672 B2 * | 6/2008 | Hiramatsu et al. .......... | 501/138 |
| 2006/0046922 A1 * | 3/2006 | Ito et al. ..................... | 501/138 |
| 2007/0149382 A1 * | 6/2007 | Ito et al. ..................... | 501/137 |

OTHER PUBLICATIONS

International Search Report and Written Opinion For Corresponding PCT/US07/60603, mailed Oct. 1, 2008, seven pages.

* cited by examiner

*Primary Examiner*—Karl E Group
(74) *Attorney, Agent, or Firm*—Rankin, Hill & Clark LLP

(57) ABSTRACT

Multilayer ceramic chip capacitors which satisfy X8R requirements and which are compatible with reducing atmosphere sintering conditions so that non-noble metals such as nickel and nickel alloys thereof may be used for internal and external electrodes are made in accordance with the invention. The capacitors exhibit desirable dielectric properties (high capacitance, low dissipation factor, high insulation resistance), excellent performance on highly accelerated life testing, and very good resistance to dielectric breakdown. The dielectric layers comprise a barium titanate base material doped with other metal oxides such as $BaO$, $Y_2O_3$, $ZrO_2$, $SiO_2$, $MgO$, $MnO$, $MoO_3$, $CaO$, $Lu_2O_3$, $Yb_2O_3$, or $WO_3$ in various combinations.

15 Claims, 2 Drawing Sheets

X8R DIELECTRIC COMPOSITION FOR USE WITH NICKEL ELECTRODES

BACKGROUND OF THE INVENTION

1. Field of Invention

This invention relates to barium titanate based dielectric compositions, and more particularly to barium titanate based dielectric compositions having relatively small proportions of guest ions such as zirconium, manganese, molybdenum, magnesium, yttrium, silicon, and additional barium dispersed within the barium titanate crystal matrix. Such a dielectric composition can be used to form multilayer ceramic chip capacitors having internal base metal electrodes formed of nickel or nickel alloys.

2. Description of Related Art

Multilayer ceramic chip capacitors have been widely utilized as miniature-sized, high capacitance, and high reliability electronic components. In accordance with increasing demands for high-performance electronic equipment, multilayer ceramic chip capacitors also have encountered marketplace demand for smaller size, higher capacitance, lower cost, and higher reliability.

Multilayer ceramic chip capacitors generally are fabricated by forming alternating layers of an internal electrode forming paste and a dielectric layer-forming paste. Such layers are typically formed by sheeting, printing, or similar techniques, followed by concurrent firing.

Generally, the internal electrodes have been formed of conductors such as silver, gold, palladium, platinum, (i.e., "noble metals") or alloys of the foregoing. Although noble metals are expensive, they can be partially replaced by the use of relatively inexpensive base metals such as nickel or copper and their alloys. A "base metal" as used herein is any metal other than silver, gold, palladium, and platinum. Base metal internal electrodes can become oxidized if fired in ambient air, so the dielectric layers and base metal internal electrode layers must be co-fired in a reducing atmosphere. Firing in a reducing atmosphere, however, causes the dielectric layers to be reduced, which decreases resistivity. Multilayer ceramic chip capacitors using non-reducible dielectric materials have been proposed, however, such devices typically have a shorter life of insulation resistance (IR) and low reliability.

The Electronic Industry Association (EIA) prescribes a standard for the temperature coefficient of capacitance (TCC) known as the X8R characteristic. The X8R characteristic requires that the change of capacitance be no greater than ±15% with respect to the reference temperature of 25° C. over the temperature range −55° C. to +150° C. X8R components exhibit capacitance aging no greater than 2.5% per decade.

SUMMARY OF THE INVENTION

The present invention provides a dielectric composition that can be used to make ceramic multilayer capacitors compatible with internal electrodes containing base metals such as nickel or nickel alloys. Capacitors may be formed from the dielectric composition of the present invention to exhibit a stable dielectric constant with a small dielectric loss and excellent reliability under highly accelerated life testing conditions.

The dielectric composition of the present invention comprises a uniform dense microstructure of grains having an average diameter of about 0.5 to about 1.5 microns. A uniform and dense grain microstructure is critical in achieving high reliability multilayer capacitors having dielectric layers thinner than about 10 microns.

In one embodiment, the dielectric composition of the present invention comprises, in addition to $BaTiO_3$, prior to firing, a blend of the oxides or carbonates of zirconium, barium, manganese, molybdenum, magnesium, yttrium and silicon. Another embodiment of the present invention is an electronic device comprising a multilayer chip comprising a dielectric layer comprising, prior to firing, $BaTiO_3$, and a blend of the oxides or carbonates of zirconium, barium, manganese, molybdenum, magnesium, yttrium and silicon.

In another embodiment, the present invention provides a method of forming an electronic component comprising applying particles of a dielectric material to a substrate and firing the substrate at a temperature sufficient to sinter the dielectric material, wherein the dielectric material comprises, prior to firing, a blend (in weight percent) of the ingredients in Table 1. It is to be understood that each numerical value herein (percentage, temperature, etc) is presumed to be preceded by "about."

TABLE 1

Oxide formulation of dielectric compositions, added oxides in mole parts, per 100 mole parts of $BaTiO_3$.

| $ZrO_2$ | BaO | MnO | $MoO_3$ | MgO | $Y_2O_3$ | $SiO_2$ |
|---|---|---|---|---|---|---|
| 0.01-2 | 2-5 | 0.05-0.3 | 0-0.4 | 0.05-2.5 | 0.5-2 | 0.3-2 |

It will be understood by those skilled in the art that equivalent formulations may be developed using the corresponding carbonates, e.g., $BaCO_3$, $MgCO_3$, or other metal salts, so long as the final proportion of metal ions in the dielectric composition is that achieved by the formulation of Table 1.

Another route is to begin with $BaTiO_3$, (i.e., a pre-sintered oxide) as well as oxides or carbonates of barium, manganese, magnesium, yttrium, and silicon, as well as an oxide or carbonate of at least one of calcium, zirconium, lutetium, ytterbium, molybdenum, and tungsten.

Another embodiment of the present invention is a method of fabricating a multilayer ceramic chip capacitor having X8R characteristics comprising:

a. providing a dielectric material comprising, prior to sintering, a blend of:
   i. $BaTiO_3$, and the following, per 100 mole parts of $BaTiO_3$:
   ii. about 0.01 to about 2 mole parts $ZrO_2$,
   iii. about 1 to about 6 mole parts $BaCO_3$,
   iv. about 0.05 to about 0.5 mole parts $MnCO_3$,
   v. about 0.01 to about 0.4 mole parts $MoO_3$,
   vi. about 0.05 to about 2.5 mole parts MgO,
   vii. about 0.5 to about 7 mole parts $Y_2O_3$, and
   viii. about 0.3 to about 4 mole parts $SiO_2$, b. forming alternately stacked layers of said dielectric material with layers of an internal electrode material comprising a transition metal, and c. firing the stack in an atmosphere at a temperature sufficient to sinter the electrode material without oxidation and fuse the dielectric material.

Another embodiment of the present invention is a method of forming an electronic component comprising:

a. alternately applying layers of
   i. any dielectric paste disclosed elsewhere herein and
   ii. a metal-containing electrode paste comprising at least one metal selected from the group consisting of transition metals other than Ag, Au, Pd, and Pt, onto
   iii. a substrate to form a stack, b. firing the stack in an atmosphere having a partial oxygen pressure of no more than about $10^{-8}$ atmosphere at a temperature sufficient to sinter the electrode metal and fuse the dielectric material.

Another embodiment of the present invention is a method of forming an electronic component comprising:
 a. alternately applying layers of
  i. any dielectric paste disclosed elsewhere herein and
  ii. a metal-containing electrode paste comprising at least one metal selected from the group consisting of Pd, Pt, and a Pd—Ag alloy, onto
  iii. a substrate to form a stack, and
 b. firing the stack at a temperature sufficient to sinter the electrode metal and fuse the dielectric material.

The capacitors fill the demand for various applications in the automotive and industrial markets and in other electronic equipment exposed to high temperatures. The increased use of electronics in automotive "under the hood" applications has created demand for this product range.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE INVENTION

Multilayer chip capacitors are fabricated by alternately stacking dielectric layers and internal electrodes to form green chips. Two types of internal electrodes are envisioned herein. The first includes base metals including nickel or nickel alloys, or other base metals such as copper. Nickel is preferred. Electronic components having base metal electrodes are fired in low-oxygen atmospheres to prevent oxidation of the base metal. A second type of internal electrode is a noble-metal electrode which may include any or all of silver, gold, palladium, and platinum. There is typically little concern of oxidation, so electronic components including noble metal electrodes may be fired in air. The dielectric composition that forms the dielectric layers is produced by wet milling the components of the dielectric with an organic vehicle system. The dielectric composition is deposited on a carrier film (such as polyester or polypropylene), a belt (such as stainless steel), paper, or a substrate (such as alumina or glass). Sheets of the dielectric are then alternately stacked with electrodes to form green chips. The dielectric compositions broadly comprise the oxides of Table 1.

TABLE 1

(repeated). Oxide formulation of dielectric compositions, added oxides in mole parts, per 100 mole parts of $BaTiO_3$.

| $ZrO_2$ | BaO | MnO | $MoO_3$ | MgO | $Y_2O_3$ | $SiO_2$ |
|---|---|---|---|---|---|---|
| 0.01-2 | 2-5 | 0.05-0.3 | 0-0.4 | 0.05-2.5 | 0.5-2 | 0.3-2 |

After the green chips are formed, the organic vehicle is removed by heating to a temperature less than about 350° C. in an air atmosphere. The atmosphere for vehicle removal is not critical. In the case of base metal electrodes, once the vehicle is removed, the green chips are then fired in a reducing atmosphere of wet nitrogen and hydrogen having an oxygen partial pressure of about $10^{-12}$ to about $10^{-8}$ atm, at a temperature of about 1200° C. to about 1350° C. Chips with noble metal electrodes may be fired in air or in an atmosphere where no special precautions are taken. Various heating profiles may be used both for removing the binder and for firing the chip.

Figure 1:
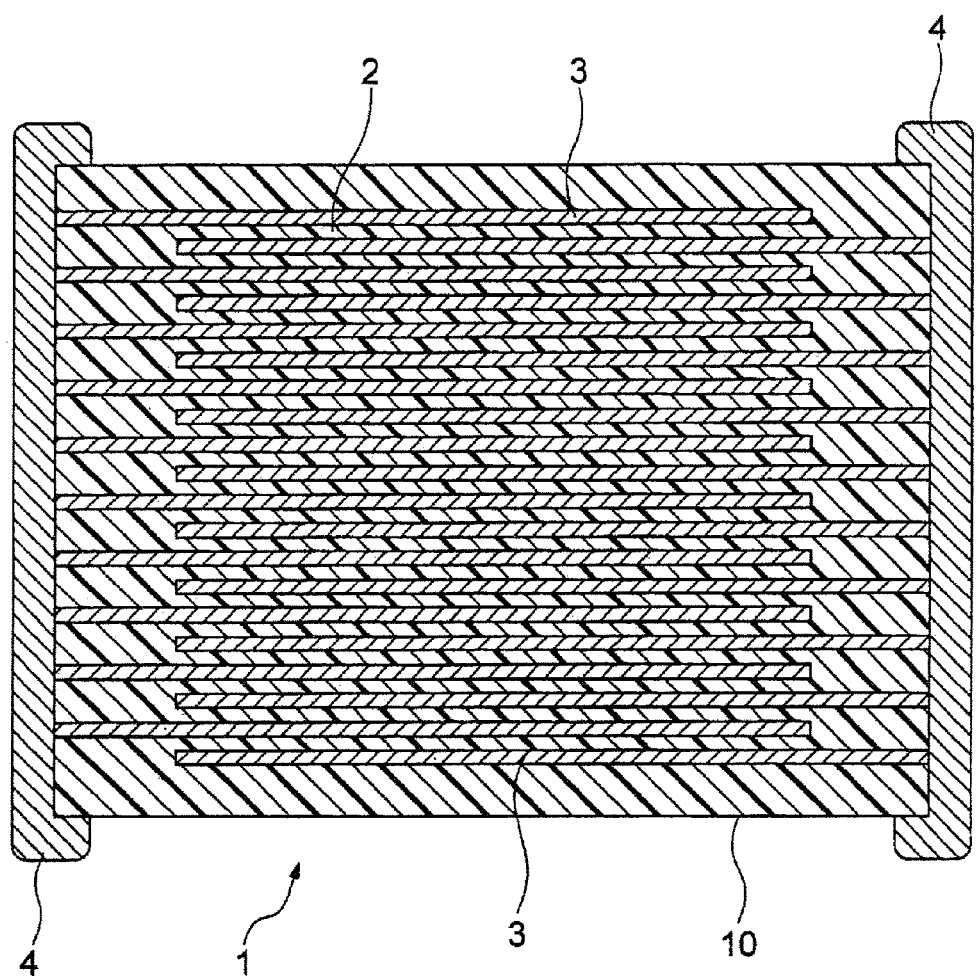
FIG. 1 is a cross-sectional view of a multilayer ceramic chip capacitor according to an embodiment of the invention.
Figure 2:
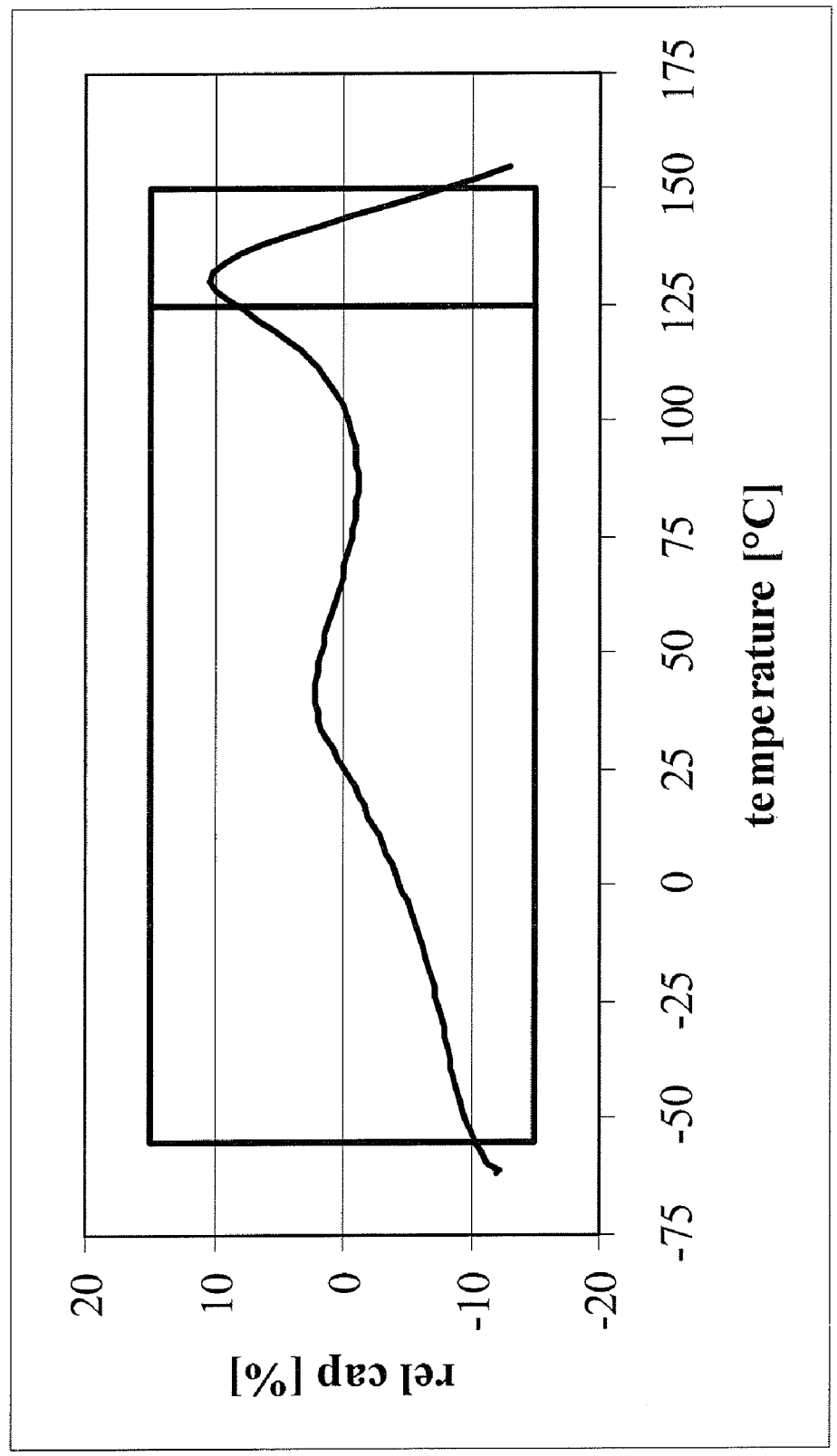
FIG. 2 shows a the relation between TCC and temperature in disc capacitor sample C-4 from Table 6. Within the graph, the largest box represents the X8R specification. The vertical bar in this box is at 125° C.

The configuration of multilayer ceramic capacitors is well known in the art. With reference to FIG. 1, an exemplary structure of a multilayer ceramic chip capacitor 1 is shown. External electrodes 4 of the capacitor 1 are disposed on side surfaces of the capacitor chip 1 and in electrical connection with internal electrode layers 3. The capacitor chip 1 has a plurality of alternately stacked dielectric layers 2. The shape of the capacitor chip 1 is not critical although it is often rectangular shaped. Also, the size is not critical and the chip may have appropriate dimensions in accordance with a particular application, typically in the range of 1.0 to 5.6 mm×0.5 to 5.0 mm×0.5 to 1.9 mm. The internal electrode layers 3 are stacked such that at opposite ends they are alternately exposed at opposite side surfaces of the chip 1. That is, the internal electrode layers 3 of one group are exposed at one side surface of the chip 1 and the internal electrode layers 3 of another group are exposed at the opposite side surface of the chip 1. One external electrode 4 is applied to one side surface of the capacitor chip 1 in electrical contact with the internal electrode layers 3 of the one group, and the other external electrode 4 is applied to the opposite side surface of the chip 1 in electrical contact with the internal electrode layers 3 of the other group.

The dielectric layers are formed of a dielectric material formed by sintering $BaTiO_3$ with a blend including oxides or carbonates of zirconium, manganese, molybdenum, magnesium, yttrium, silicon, and additional barium, as in Table 1. A sintering aid such as $SiO_2$ may be used. It should be evident to those who are familiar with the art that the above mentioned oxides in their hydroxide or other forms such as carbonates, acetates, nitrates, and organometallic compounds such as metal formates, oxalates, etc., have the same effect, so long as the desired metal ion is provided in the desired quantity.

TABLE 2

Alternate formulations for dielectric compositions, added oxides in mole parts, per 100 mole parts of $BaTiO_3$.

| $ZrO_2$ | BaO | MnO | $MoO_3$ | MgO | $Y_2O_3$ | $SiO_2$ | CaO | $Lu_2O_3$ | $Yb_2O_3$ | $WO_3$ |
|---|---|---|---|---|---|---|---|---|---|---|
| 0.1-1.75 | 2.5-4.5 | 0.1-0.4 | 0.02-0.3 | 0.05-2 | 1-6 | 1-3 | | | | |
| | 1.5-6 | 0.1-0.5 | | 0.5-2 | 0.25-2.5 | 1-4 | | | | |
| 0.1-3.5 | 2-5 | 0.05-0.5 | 0.01-0.4 | 0.05-2.5 | 0.5-2.0 | 0.3-2.0 | 0-3 | 0-2.5 | 0-2 | 0-0.2 |

Other compounds may be present in the dielectric material provided that the other compound does not adversely affect dielectric properties. Such compounds are usually found in the raw materials as impurities.

The dielectric compositions herein possess fine crystal grains that typically have a mean size of about 0.5 to about 1.5 microns, with a grain size of less than about 0.7 micron being preferred.

Each dielectric layer has a thickness of up to about 20 microns. Preferably, the thickness of each dielectric layer is from about 4 microns to about 15 microns. More preferably, the thickness of each dielectric layer is from about 6 microns to about 12 microns. The compositions herein may be employed to make multilayer ceramic chip capacitors having thin dielectric layers. The number of dielectric layers stacked in a chip capacitor is generally up to about 800, and preferably from about 3 to about 400.

The multilayer ceramic chip capacitor of the invention generally is fabricated by forming a structure as indicated in FIG. 1 by either stacking dielectric (ceramic) sheets on which the electrode pattern is printed by screen printing or by forming a green stack by alternately screen printing ceramic and electrode pastes. For both methods of forming the ceramic layers the powder is dispersed in a solvent, and binders are added to give the desired viscosity for processing and desired mechanical strength after drying. The ceramic sheets can be formed, for example, by doctor-blading, in which after drying the electrode pattern is printed. Alternatively, the ceramic sheets can be formed by screen printing a green stack formation with intermediate drying of the alternative printings of electrode and dielectric pastes. The green chips are separated in such a way that neighboring electrodes are connected to opposite ends of the MLCC structure as in FIG. 1. After firing, the chip is tumbled dry in a medium such as alumina or silica to round off corners. Next, a conductive paste, containing, for example, copper is then applied to both ends to connect the exposed inner electrodes together to make terminations, i.e., external electrodes. The chip is then termination fired at about 800° C. in a nitrogen atmosphere to sinter the conductor (e.g., copper) into a solid conduction pad at both ends, to form a multilayer capacitor. The terminations are external electrodes 4 as shown in FIG. 1.

One embodiment of the invention includes a multilayer ceramic chip capacitor comprising a fired collection of alternately stacked layers of any dielectric material disclosed herein and layers of an internal electrode material comprising a transition metal other than Ag, Au, Pd, or Pt. In such multilayer ceramic chip capacitors, the dielectric layers, after firing, have a thickness of no greater than about 15 microns, and the capacitor exhibits a dielectric constant (K) of at least about 2000 and dissipation factor (DF) of less than about 2%, and otherwise meets EIA X8R standards.

Another embodiment of the invention involves a multilayer ceramic chip capacitor comprising a fired collection of alternately stacked layers of any dielectric material disclosed herein and layers of an internal electrode material comprising a transition selected from the group consisting of Pd, Pt, and a Pd—Ag alloy, and combinations thereof. In such multilayer ceramic chip capacitors, the dielectric layers, after firing, have a thickness of no greater than about 15 microns, and the capacitor has a dielectric constant (K) greater than about 2000, and a dissipation factor (DF) of less than about 2%, and otherwise meets EIA X8R standards.

Another embodiment is a method of forming an electronic component comprising: alternately applying layers of an oxide-containing dielectric material comprising any dielectric paste composition disclosed herein and layers of a metal-containing electrode paste comprising at least one metal selected from the group consisting of transition metals other than Ag, Au, Pd, and Pt, onto a substrate to form a stack, firing the stack in an atmosphere having a partial oxygen pressure of no more than about $10^{-8}$ atmosphere at a temperature sufficient to sinter the electrode metal and fuse the dielectric material.

Another embodiment is a method of forming an electronic component comprising: alternately applying layers of an oxide-containing dielectric material comprising any dielectric paste composition disclosed herein and layers of a metal-containing electrode paste comprising at least one metal selected from the group consisting of Pd, Pt, and a Pd—Ag alloy, onto a substrate to form a stack, firing the stack at a temperature sufficient to sinter the electrode metal and fuse the dielectric material.

Each major constituent of the electronic components is described in turn.

Dielectric Pastes. A paste for forming the dielectric layers can be obtained by mixing an organic vehicle with a raw dielectric material, as disclosed herein. Also useful are precursor compounds that convert to such oxides and composite oxides upon firing, as stated hereinabove. The dielectric material is obtained by selecting compounds containing such oxides, or precursors of such oxides, and mixing them in the appropriate proportions. The proportion of such compounds in the raw dielectric material is determined such that after firing, the desired dielectric layer composition may be obtained. The raw dielectric material is generally used in powder form having a mean particle size of about 0.1 to about 1.5 microns, preferably about 1 micron or less, and more preferably about 0.5 to about 0.9 microns.

Organic Vehicle. The organic vehicle is a binder in an organic solvent or a binder in water. The choice of binder used herein is not critical; conventional binders such as ethyl cellulose, polyvinyl butanol, ethyl cellulose, and hydroxypropyl cellulose, and combinations thereof are appropriate together with a solvent. The organic solvent is also not critical and may be selected in accordance with a particular application method (i.e., printing or sheeting), from conventional organic solvents such as butyl carbitol, acetone, toluene, ethanol, diethylene glycol butyl ether; 2,2,4-trimethyl pentanediol monoisobutyrate (Texanol®); alpha-terpineol; beta-terpineol; gamma terpineol; tridecyl alcohol; diethylene glycol ethyl ether (Carbitol®), diethylene glycol butyl ether (Butyl Carbitol®), diethylene glycol dibutyl ether (Dibutyl Carbitol®) and propylene glycol; and blends thereof. Products sold under the Texanol® trademark are available from Eastman Chemical Company, Kingsport, Tenn.; those sold under the Dowanol® and Carbitol® trademarks are available from Dow Chemical Co., Midland, Mich. Alternatively, the vehicle for the ceramic slurry could be water.

When water is the vehicle, the binder can be selected from polyvinyl alcohol (PVA) or polyvinyl acetate (PVAc) in combination with water. It should be noted that PVA and PVAc are generally not compatible with boron-containing ceramic dielectric powders. An aqueous slurry including a boron containing glass together with PVA and/or PVAc tends to suffer severe gelation. Therefore, ceramic dielectric powders that do not contain boron, as disclosed in this invention, are of particular importance for water based slurry processing. Alternatively, it is possible to avoid gelation because it is believed that such does not occur if emulsion type acrylate binders are used in a water environment.

No particular limit is imposed on the organic vehicle content of the respective pastes (dielectric or electrode pastes). Often the paste contains about 1 to 5 wt % of a binder and about 10 to 50 wt % of an organic solvent, with the balance being either the metal component (for an electrode) or a dielectric component (for a dielectric layer). If desired, the respective pastes may contain up to about 10 wt % of other additives such as dispersants, plasticizers, dielectric compounds, and insulating compounds.

Internal Electrode. A paste for forming internal electrode layers is obtained by mixing a conductive material containing either a base metal (such as nickel or copper) or a noble metal (such as silver, gold, palladium, or platinum), with an organic vehicle. Combinations of the respective base metals or noble metals and their alloys are also useful. The conductive material used herein includes conductors such as conductive metals and alloys as mentioned herein and various compounds which convert into such conductors upon firing, for example, oxides, organometallic compounds and resinates. Any pure, commercially available nickel paste is suitable herein. A suitable noble metal paste containing silver is EL45-006. Both are available commercially from Ferro Corporation of Cleveland, Ohio.

With reference to FIG. 1, the conductor that forms the internal electrode layers 3 is not critical, although a base metal preferably is used since the dielectric material of the dielectric layers 2 has anti-reduction properties. Typical base metals include nickel and its alloys. Preferred nickel alloys contain at least one other metal selected from Mn, Cr, Co, and Cu. Alloys containing at least about 95 wt % of nickel are preferred. It is to be noted that nickel and nickel alloys may contain up to about 0.1 wt % of phosphorous and other trace components (i.e., impurities). The thickness of the internal electrode layers may be controlled to suit a particular application, but the layers are typically up to about 5 microns thick. Preferably, an internal electrode layer has a thickness of about 0.5 to about 3 microns and more preferably about 1.2 to about 1.5 microns. A noble-metal internal electrode layer 3 may be chosen from Ag, Au, Pd or Pt (or combinations thereof). Preferably, the noble metal is chosen from Pt, Pd, Pt—Pd alloys and Pd—Ag alloys. When a Pd—Ag alloy is used, the weight ratio thereof is preferably about 99:1 to about 7:3.

External Electrode. The conductor that forms the external electrodes 4 is not critical, although inexpensive metals such as nickel, copper, and alloys of either or both, optionally containing Mn, Cr, Co, or Al, are preferred. The thickness of the external electrode layers may be controlled to suit a particular application, but the layers are typically up about 10 to about 50 microns thick, preferably about 20 to about 40 microns thick. Paste for forming external electrodes is prepared by the same method as for the internal electrodes.

A green chip then may be prepared from the dielectric layer-forming paste and the internal electrode layer-forming paste. In the case of a printing method, a green chip is prepared by alternately printing the pastes onto a substrate of a polyester film, for example, polyethylene terephthalate (PET), in laminar form, cutting the laminar stack to a predetermined shape and separating it from the substrate. Also useful is a sheeting method wherein a green chip is prepared by forming green sheets from the dielectric layer-forming paste, printing the internal electrode layer-forming paste on the respective green sheets, and stacking the printed green sheets. After the organic vehicle is removed from the green chip, it is fired. The organic vehicle may be removed under conventional conditions, by heating at a rate of 0.01° C. to 20° C./hour, more preferably about 0.03-0.1° C./hour, with a hold temperature of about 150° C. to about 350° C., preferably about 200° C. to about 300° C., more preferably about 250° C., and a hold time of about 30-700 minutes, preferably about 200-300 minutes in an air atmosphere.

Firing. The green chip is then fired in an atmosphere, which is determined according to the type of conductor in the internal electrode layer-forming paste. Where the internal electrode layers are formed of a base metal conductor such as nickel and nickel alloys, the firing atmosphere should have a low oxygen concentration, for example, a wet $H_2/N_2$ atmosphere. Such an atmosphere may have an oxygen partial pressure of about $10^{-12}$ to about $10^{-8}$ atmospheres. Sintering at a partial pressure lower than about $10^{-12}$ atm should be avoided, since at such low pressures the conductor can be abnormally sintered and may become disconnected from the dielectric layers. At oxygen partial pressures above about $10^{-8}$ atm, the internal base metal electrode layers may be oxidized. Oxygen partial pressures of about $10^{-11}$ to about $10^{-9}$ atm are most preferred for base metal electrodes.

For noble metal internal electrodes, the firing atmosphere is less critical (i.e., the presence or absence of oxygen) because noble metals are less susceptible to oxidation, or in certain cases, impervious to oxidation.

For firing, the temperature is raised from room temperature to a peak temperature of from about 1150° C. to about 1350° C., more preferably from about 1250° C. to about 1350° C. The temperature is held for about two hours to enhance densification. Lower hold temperatures provide insufficient densification whereas higher hold temperatures can lead to very large grains. The firing is preferably conducted in a reducing atmosphere. An exemplary firing atmosphere includes wet $N_2$, or a humidified mixture of $N_2$ and $H_2$ gases. The sintering ramp rate is about 50° C. to about 500° C./hour, preferably about 200° C. to 300° C./hour; hold temperature of about 1200° C. to about 1350° C., preferably about 1250° C. to about 1350° C., more preferably about 1280° C. to about 1340° C. The hold time is about 0.5 to about 8 hours, preferably about 1 to 3 hours, and the cooling rate is about 50° C. to 500° C./hour, preferably about 200° C. to 300° C./hour.

The organic vehicle removal and firing may be carried out either continuously or separately. If continuously, the process includes organic vehicle removal, changing the atmosphere without cooling, heating to the firing temperature, holding at the firing temperature for a specified time and cooling afterwards. If separately, after organic vehicle removal and cool down, the temperature of the chip is raised to the sintering temperature and the atmosphere then is changed to a reducing atmosphere.

The resulting chip may be polished at end faces by barrel tumbling and/or sand blasting, for example, before the external electrode-forming paste is printed or transferred and fired to form external electrodes (terminations). Firing of the external electrode-forming paste may be carried out in a dry nitrogen atmosphere (about $10^{-6}$ atm oxygen partial pressure), at about 600° C. to 800° C., for about 10 minutes to about 1 hour.

If necessary, pads are formed on the external electrodes by plating or other methods known in the art. The multilayer ceramic chip capacitors of the invention can be mounted on printed circuit boards, for example, by soldering.

EXAMPLES

The following examples are provided to illustrate preferred aspects of the invention and are not intended to limit the scope of the invention.

Example 1

Dielectric formulations were prepared by mixing and milling $BaTiO_3$ (BT), and oxides and carbonates to provide guest ions as given in Table 3. For this, 250 grams of BT was weighed in a 1 liter polyethylene bottle, together with the indicated amount in moles, of guest ion components, per 100 moles BT. After adding water and a dispersant, Dispex® A-40 (commercially available from Ciba Specialty Chemicals Maastricht B. V., Maastricht, Netherlands), and approximately 1.8 kg of 2 mm zirconia (YTZ) balls, the powders are milled in water to a $D_{50}$ between 0.5 microns and 0.7 microns. Then the powders are dried at 150° C., discs are pressed and provided with nickel electrodes. These discs are sintered at temperatures between 1280° C. and 1340° C. in moistened $H_2/N_2$ and reoxidized in moistened $N_2$ at 1000° C. The TCC behavior of the discs is tested, and K-values are determined from the capacity values at 25° C. Results are presented in Table 4.

TABLE 3

Compositional variations of dielectric compositions in moles of added metal per 100 moles of BT.

| sample | Ba | Y | Zr | Si | Mg | Mn | Mo |
|---|---|---|---|---|---|---|---|
| A-1 | 3.25 | 3.0 | 0.5 | 1.76 | 1.2 | 0.2 | 0.1 |
| A-2 | 2.70 | 4.0 | 0.5 | 1.76 | 1.2 | 0.2 | 0.1 |
| A-3 | 3.75 | 4.0 | 1.00 | 1.76 | 1.2 | 0.2 | 0.1 |
| A-4 | 3.20 | 4.0 | 1.00 | 1.76 | 1.2 | 0.2 | 0.033 |
| A-5 | 3.25 | 4.0 | 0.5 | 1.76 | 1.2 | 0.2 | 0.033 |
| A-6 | 2.70 | 3.0 | 0.5 | 1.76 | 1.2 | 0.2 | 0.033 |
| A-7 | 3.20 | 3.0 | 1.00 | 1.76 | 1.2 | 0.2 | 0.1 |

TABLE 3-continued

Compositional variations of dielectric compositions in moles of added metal per 100 moles of BT.

| sample | Ba | Y | Zr | Si | Mg | Mn | Mo |
|---|---|---|---|---|---|---|---|
| A-8 | 3.75 | 3.0 | 1.00 | 1.76 | 1.2 | 0.2 | 0.033 |
| A-9 | 3.75 | 3.0 | 1.00 | 1.76 | 1.2 | 0.2 | 0.1 |
| A-10 | 3.75 | 3.0 | 1.00 | 1.76 | 1.4 | 0.2 | 0.033 |
| A-11 | 3.75 | 3.0 | 1.00 | 1.76 | 1.6 | 0.2 | 0.033 |
| A-12 | 4.25 | 3.0 | 1.5 | 1.76 | 1.2 | 0.2 | 0.033 |

TABLE 4

Disc and MLCC results of compositional variations of Table 3

| | | Disc | | | MLCC | | |
|---|---|---|---|---|---|---|---|
| sample | ρ | K | Df [%] | TCC @ 150° C. [%] | K | IR [GΩ] | TCC @ 150° C. [%] |
| A-1 | 5.87 | 2275 | 0.90 | −7 | 2400 | 38.5 | −14 |
| A-2 | 5.85 | 2400 | 1.03 | −7.5 | 2900 | 30 | −18 |
| A-3 | 5.80 | 2275 | 1.10 | −4 | 2400 | 47 | −12 |
| A-4 | 5.88 | 2350 | 1.11 | −5.8 | 2500 | 48 | −14 |
| A-5 | 5.76 | 2320 | 1.00 | −6.5 | 2800 | 51 | −15 |
| A-6 | 5.89 | 2400 | 1.00 | −9.2 | 2700 | 39 | −19 |
| A-7 | 5.92 | 2350 | 0.90 | −7.6 | 2700 | 37 | −16 |
| A-8 | 5.92 | 2200 | 1.01 | −6.5 | 1850 | 75 | −19 |
| A-9 | 5.89 | 2300 | 0.97 | −3.5 | 2150 | 49 | −19 |
| A-10 | 5.90 | 2050 | 0.94 | −6 | 1830 | 80 | −15 |
| A-11 | 5.90 | 2080 | 0.95 | −6 | 1970 | 66 | −14 |
| A-12 | 5.89 | 2080 | 0.95 | −6 | 2025 | 69 | −16 |

Important from these experiments is the tendency between compositional variations and the TCC at 150° C. for disc and MLCCs. Due to the applied field, the TCC rotates in clockwise direction (more negative) resulting in an out of specification TCC curve in MLCCs at the upper temperature limit of the X8R specification (i.e., 150° C.). Hence, the TCC at 150° C. should be sufficiently high for disc capacitors in order to allow a MLCC made with the inventive dielectric composition to meet the X8R specification. However, whether a MLCC meets the specification is determined not only by the sufficiently high value of the TCC at 150° C. in discs but also by the dielectric constant (K) value. It is known that material with a high K-value demonstrates a larger clockwise rotation in MLCCs in comparison to a low K-value material.

Example 2

Dielectric formulations have been prepared according to the procedures of Example 1, using the formulations on the left side of Table 5. The powders are dried at 150° C. and tested in disc capacitors. Results of electrical testing are also presented in Table 5 (right 3 columns).

TABLE 5

Compositional variations of dielectric compositions in moles of added metal per 100 moles of BT and Disc properties of compositions

| sample | Ba | Y | Ca | Zr | Lu | Si | Mg | Mn | Mo | W | K | Df [%] | TCC 150° C. |
|---|---|---|---|---|---|---|---|---|---|---|---|---|---|
| B-1 | 2.75 | 3.0 | | | | 1.76 | 0.87 | 0.2 | 0.1 | 0.1 | 2380 | 0.95 | −12 |
| B-2 | 5.5 | 6.0 | | | | 3.52 | 1.74 | 0.4 | 0.2 | 0.2 | 2450 | 1.05 | −11 |
| B-3 | 2.0 | 2.25 | | | 0.75 | 1.76 | 0.87 | 0.2 | 0.1 | 0.1 | 2200 | 1.03 | −16 |
| B-4 | 2.0 | 1.5 | | | 1.5 | 1.76 | 0.87 | 0.2 | 0.1 | 0.1 | 2200 | 0.95 | −9 |
| B-5 | 2.0 | 0.75 | | | 2.25 | 1.76 | 0.87 | 0.2 | 0.1 | 0.1 | 2040 | 1.01 | −9 |
| B-6 | 1.9 | 3.0 | | | | 1.76 | 0.87 | 0.2 | | 0.1 | 2611 | 3.68 | −23 |
| B-7 | 2.75 | 3.0 | 3.0 | 3.0 | | 1.76 | 0.87 | 0.2 | 0.1 | 0.1 | 2800 | 1.05 | −22 |
| B-8 | 5.75 | 3.0 | | 3.0 | | 1.76 | 0.87 | 0.2 | 0.1 | 0.1 | 3000 | 1.07 | −20 |
| B-9 | 3.0 | 3.0 | | | | 1.76 | 1.2 | 0.2 | 0.1 | 0.1 | 2230 | 0.94 | −12 |
| B-10 | 4.25 | 3.0 | | 1.5 | | 1.76 | 0.87 | 0.2 | 0.1 | 0.1 | 2440 | 1.20 | −14 |
| B-11 | 3.75 | 3.0 | | 0.75 | | 1.76 | 1.2 | 0.2 | 0.1 | 0.1 | 2120 | 0.89 | −11 |
| B-12 | 3.75 | 3.0 | | 0.75 | | 1.76 | 1.2 | 0.2 | 0.1 | 0.1 | 2100 | 0.90 | −7 |

Example 3

Dielectric formulations have been prepared according to the procedures of Example 1, using the formulations on the left side of Table 6. The powders are dried at 150° C. and tested in disc capacitors. Results of electrical testing are also presented in Table 6 (right 3 columns).

TABLE 6

Compositional variations of dielectric compositions of Example 3 in moles of added metal per 100 moles of BT and Disc properties of compositions

| sample | Ba | Y | Zr | Lu | Yb | Si | Mg | Mn | Mo | K | Df [%] | TCC [150° C.] |
|---|---|---|---|---|---|---|---|---|---|---|---|---|
| C-1 | 3.75 | 3 | 1 | | | 1.76 | 1.6 | 0.2 | 0.033 | 2240 | 1.11 | −7 |
| C-2 | 3.75 | 3 | 1 | | | 1.76 | 1.6 | 0.2 | 0.033 | 2090 | 1.04 | −6 |
| C-3 | 3.75 | 3 | 1 | | | 1.76 | 1.6 | 0.2 | 0.067 | 2280 | 1.02 | −5 |
| C-4 | 3.75 | 3 | 1 | | | 1.76 | 1.6 | 0.2 | 0.1 | 2270 | 1.00 | −6 |
| C-5 | 1.9 | 3.0 | | | | 1.76 | 0.87 | 0.2 | 0.1 | 2400 | 1.09 | −19 |
| C-6 | 1.8 | 3.0 | | | | 1.76 | 0.87 | 0.2 | | 1775 | 2.24 | −20 |
| C-7 | 3.75 | 3 | 1 | | | 1.76 | 1.6 | 0.3 | 0.033 | 2350 | 0.80 | −6 |
| C-8 | 3.75 | 3 | 1 | | | 1.76 | 1.6 | 0.4 | 0.033 | 2260 | 0.74 | −7 |
| C-9 | 2.8 | 3.0 | | | | 1.76 | 1.2 | 0.2 | | 2300 | 1.01 | −12 |
| C-10 | 1.85 | 3.0 | | | | 1.76 | 1.2 | 0.2 | | 2350 | 0.99 | −18 |
| C-11 | 3.75 | 3 | 1 | | | 1.96 | 1.6 | 0.2 | 0.033 | 2360 | 0.87 | −8 |
| C-12 | 3.75 | 3 | 1 | | | 2.5 | 1.6 | 0.2 | 0.033 | 2620 | 0.92 | −8 |
| C-13 | 3.55 | 3.0 | 0.75 | | | 1.76 | 1.2 | 0.2 | | 2150 | 0.91 | −7 |
| C-14 | 3.55 | 1.5 | 0.75 | 1.5 | | 1.76 | 1.2 | 0.2 | | 2000 | 0.96 | −4 |
| C-15 | 3.55 | 1.5 | 0.75 | | 1.5 | 1.76 | 1.2 | 0.2 | | 2100 | 1.04 | −4 |
| C-16 | 3.55 | 3.0 | 0.75 | | | 1.76 | 1.2 | 0.2 | | 2120 | 0.92 | −10 |
| C-17 | 3.55 | 1.5 | 0.75 | 1.5 | | 1.76 | 1.2 | 0.2 | | 2070 | 0.94 | −6 |

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

What is claimed is:

1. A powder composition for use in forming a dielectric material for use in a multilayer ceramic chip capacitor comprising, prior to sintering, a blend of:
  a. $BaTiO_3$, and the following, per 100 mole parts of $BaTiO_3$:
  b. about 0.01 to about 2 mole parts $ZrO_2$,
  c. about 1 to about 6 mole parts $BaCO_3$,
  d. about 0.05 to about 0.5 mole parts $MnCO_3$,
  e. about 0.01 to about 0.4 mole parts $MoO_3$,
  f. about 0.05 to about 2.5 mole parts MgO,
  g. about 0.5 to about 7 mole parts $Y_2O_3$, and
  h. about 0.3 to about 4 mole parts $SiO_2$.

2. The composition of claim 1 comprising a blend of:
  a. $BaTiO_3$, and the following, per 100 mole parts of $BaTiO_3$:
  b. about 0.1 to about 1.75 mole parts $ZrO_2$,
  c. about 2.5 to about 4.5 mole parts $BaCO_3$,
  d. about 0.1 to about 0.4 mole parts $MnCO_3$,
  e. about 0.02 to about 0.3 mole parts $MoO_3$,
  f. about 0.5 to about 2 mole parts MgO,
  g. about 1 to about 6 mole parts $Y_2O_3$,
  h. about 1 to about 3 mole parts $SiO_2$.

3. A powder composition for use in forming a dielectric material for use in a multilayer ceramic chip capacitor comprising a blend of:
  a. $BaTiO_3$, and the following, per 100 mole parts of $BaTiO_3$:
  b. about 1.5 to about 6 mole parts $BaCO_3$,
  c. about 0.1 to about 0.5 mole parts $MnCO_3$,
  d. about 0.5 to about 2 mole parts MgO,
  e. about 0.5 to about 2.5 mole parts of $Lu_2O_3$, f. about 0.25 to about 3.5 mole parts $Y_2O_3$, and g. about 1 to about 4 mole parts $SiO_2$.

4. The composition of claim 3 further comprising, per 100 mole parts $BaTiO_3$, about 0.5 to about 3.5 mole parts $ZrO_2$.

5. A powder composition for use in forming a dielectric material for use in a multilayer ceramic chip capacitor comprising a blend of:

a. $BaTiO_3$, and the following, per 100 mole parts of $BaTiO_3$:

b. about 1.5 to about 6 mole parts $BaCO_3$, c. about 0.1 to about 0.5 mole parts $MnCO_3$, d. about 0.5 to about 2 mole parts MgO, e. about 0.25 to about 3.5 mole parts $Y_2O_3$, f. about 1 to about 4 mole parts $SiO_2$, and g. about 0.5 to about 3.5 mole parts $ZrO_2$.

6. The composition of claim 3, further comprising about 0.02 to about 0.3 mole parts $MoO_3$.

7. The composition of claim 3, further comprising about 0.5 to about 3.5 mole parts $CaCO_3$.

8. The composition of claim 3, further comprising about 0.5 to about 2.5 mole parts of $Yb_2O_3$.

9. The composition of claim 3, further comprising about 0.01 to 0.5 mole parts $MoO_3$.

10. The composition of claim 3, further comprising about 2 to about 4 mole parts $WO_3$.

11. The composition of claim 5, further comprising about 0.01 to about 0.5 mole parts $CaCO_3$.

12. The composition of claim 5, further comprising about 0.5 to about 2.5 mole parts $Lu_2O_3$.

13. The composition of claim 5, further comprising about 0.5 to about 2 mole parts $Yb_2O_3$.

14. The composition of claim 5, further comprising about 0.5 to about 2.5 mole parts $MoO_3$.

15. The composition of claim 5, further comprising about 0.01 to 0.5 mole parts $WO_3$.

\* \* \* \* \*